(12) United States Patent
Bai (10) Patent No.: US 8,417,118 B2
(45) Date of Patent: Apr. 9, 2013

(54) COLORLESS DENSE WAVELENGTH DIVISION MULTIPLEXING TRANSMITTERS

(75) Inventor: Yu Sheng Bai, Los Altos Hills, CA (US)

(73) Assignee: Futurewei Technologies, Inc., Plano, TX (US)

( * ) Notice: Subject to any disclaimer, the term of this patent is extended or adjusted under 35 U.S.C. 154(b) by 370 days.

(21) Appl. No.: 12/619,717

(22) Filed: Nov. 17, 2009

(65) Prior Publication Data

US 2011/0038635 A1  Feb. 17, 2011

Related U.S. Application Data (60) Provisional application No. 61/234,175, filed on Aug. 14, 2009.

(51) Int. Cl.
*H04J 14/06* (2006.01)
*H04B 10/00* (2006.01)
*H04B 10/04* (2006.01)

(52) U.S. Cl.
USPC .............................. 398/65; 398/152; 398/184

(58) Field of Classification Search .................... 398/65, 398/82, 87, 152, 184
See application file for complete search history.

(56) References Cited

U.S. PATENT DOCUMENTS

| | | | | |
|---|---|---|---|---|
| 6,229,937 B1 * | 5/2001 | Nolan et al. | | 385/24 |
| 6,275,317 B1 * | 8/2001 | Doerr et al. | | 398/201 |
| 6,487,336 B1 * | 11/2002 | Yao | | 385/24 |
| 7,099,530 B2 * | 8/2006 | Shin et al. | | 385/27 |
| 7,167,649 B2 | 1/2007 | Song et al. | | |
| 7,313,157 B2 * | 12/2007 | Sorin et al. | | 372/50.1 |
| 2004/0067059 A1 | 4/2004 | Song et al. | | |
| 2005/0089270 A1 | 4/2005 | Shin et al. | | |
| 2005/0111073 A1 * | 5/2005 | Pan et al. | | 359/280 |
| 2005/0111848 A1 | 5/2005 | Grubb et al. | | |
| 2005/0135449 A1 | 6/2005 | Sorin et al. | | |
| 2008/0279557 A1 | 11/2008 | Park et al. | | |

FOREIGN PATENT DOCUMENTS

| | | |
|---|---|---|
| CN | 1497894 A | 5/2004 |
| CN | 1545239 A | 11/2004 |

OTHER PUBLICATIONS

Khazanov, Efim, "Novel Faraday Mirror for Lasers with High Average Power," CLEO 2001, CtuM49, 2001, p. 190.

(Continued)

*Primary Examiner* — Dalzid Singh
(74) *Attorney, Agent, or Firm* — Conley Rose, P.C.; Grant Rodolph (57) ABSTRACT

An apparatus comprising a plurality of laser transmitters each comprising a polarization rotator, a polarization rotator mirror coupled to the laser transmitters, and a multiplexer positioned between the laser transmitters and the polarization rotator mirror. Also included is an apparatus comprising a first rotator configured to rotate light polarization by about 45 or about −45 degrees, a second rotator configured to rotate light polarization by about 45 or about −45 degrees, a mirror coupled to one side of the second rotator and configured to reflect at least a portion of the light, and a wavelength division multiplexing (WDM) filter positioned between the first rotator and the second rotator.

22 Claims, 7 Drawing Sheets

OTHER PUBLICATIONS

Martinelli, Mario, "A Universal Compensator for Polarization Changes Induced by Birefringence on a Retracing Beam," Optics Communications, vol. 72, No. 6, Aug. 15, 1989, pp. 341-344.

Vyrsokinos, K., et al., "Polarization Insensitive NOLM Employing a Faraday Rotator Mirror," ECOC 2004, Tech. Dig., We.4, 2004, p. 14.

Pool, et al., "Polarization Effects in Lightwave Systems," Chapter 6—Optical Fiber Communication Systems, vol. IIIA, Academic Press, San Diego, 1997, pp. 114-161.

Vyrsokinos, K., et al., "Polarization Insensitive NOLM Employing a Faraday Rotator Mirror," ECOC 2004, Tech. Dig., We.4, 2004, p14.

Foreign Communication from a Counter-Part Application, PCT Application PCT/CN2010/076009, International Search Report dated Nov. 25, 2010, 5 pages.

Foreign Communication from a Counter—Part Application, PCT Application PCT/CN2010/076009, Written Opinion dated Nov. 25, 2010, 9 pages.

Foreign Communication From a Counterpart Application—Extended European Search Report, 10807999.7, Dec. 12, 2012, 5 pages.

* cited by examiner

COLORLESS DENSE WAVELENGTH DIVISION MULTIPLEXING TRANSMITTERS

CROSS-REFERENCE TO RELATED APPLICATIONS

The present application claims priority to U.S. Provisional Patent Application No. 61/234,175 filed Aug. 14, 2009 by Yu Sheng Bai and entitled "Method and Apparatus for Colorless Dense Wavelength Division Multiplexing Transmitters," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Optical transmitters in some applications may comprise semiconductor lasers, such as Fabry-Perot (FP) lasers or distributed feedback (DFB) lasers. A FP laser comprises a semiconductor gain block (laser chip) that has two reflection facets at its opposite sides, e.g. in the direction of transmission. The semiconductor gain block between the two reflection facets may determine the cavity of the FP laser. The output wavelength of the FP laser is defined by the length of the cavity and the index of refraction of the gain block. The lasing condition of the FP laser may be satisfied for a plurality of wavelengths that correspond to a plurality of longitudinal modes in the cavity. The FP laser may have a relatively broad output wavelength spectrum, e.g. from about a few nanometers (nm) to about ten nm, around the gain peak. In fiber optic communication networks, such wavelength spectrum may not be suited for long transmission distances (e.g. greater than about ten kilometers (km)) and/or high data rate transmissions (e.g. greater than about one gigabits per second (Gbps)) because of chromatic dispersion in fibers.

A single mode laser, such as a DFB laser, may be more suited for long transmission distances and/or high data rate transmissions because of higher tolerance of its single mode operation (single output wavelength) to fiber dispersion. Similar to the FP laser, the DFB may comprise a laser chip with two facets. However, the lasing wavelength of the DFB laser is defined by a Bragg grating in the laser chip and the two facets may be coated with anti-reflection (AR) thin films to suppress multiple lasing modes. Typically, in wavelength division multiplexing (WDM) networks, multiple DFB lasers are used to emit a plurality of distinct wavelength channels. For example, the wavelength channels are spaced by about 50 GHz or about 100 GHz, which matches the wavelength grids specified by the International Telecommunication Union Telecommunication Standardization Sector (ITU-T). However, to support WDM networks operations and provide additional spare parts, a large inventory of network cards (transponder cards) that comprise different DFB lasers is needed, which increases cost in WDM networks. Alternatively, fixed wavelength DFB lasers can be replaced by a smaller number of tunable lasers to reduce inventory size. However, since tunable lasers have a higher manufacturing cost than the DFB lasers, the overall cost of the system may not be substantially reduced.

SUMMARY

In one embodiment, the disclosure includes an apparatus comprising a plurality of laser transmitters each comprising a polarization rotator, a polarization rotator mirror coupled to the laser transmitters, and a multiplexer positioned between the laser transmitters and the polarization rotator mirror.

In another embodiment, the disclosure includes an apparatus comprising a first rotator configured to rotate light polarization by about 45 or about −45 degrees, a second rotator configured to rotate light polarization by about 45 or about −45 degrees, a mirror coupled to one side of the rotator and configured to reflect at least a portion of the light, and a WDM filter positioned between the first rotator and the second rotator.

In yet another embodiment, the disclosure includes a method comprising rotating a polarization of a light wave from a semiconductor laser by about 45 or about −45 degrees, multiplexing the light wave with other light waves into a combined light wave, rotating and reflecting the combined light wave to generate a reflected light wave with polarization rotated by about 90 or about −90 degrees, demultiplexing a reflected light wave corresponding to the laser from the reflected light wave, and rotating the polarization of the reflected light wave by about 45 or about −45 degrees.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Recently, a multi-wavelength dense WDM (DWDM) transmitter that is based on a FP laser design has been proposed for WDM networks. The multi-wavelength DWDM transmitter may comprise a plurality of FP lasers coupled to a WDM filter, as described in U.S. Pat. No. 7,167,649 issued Jan. 23, 2007 by Song et al. and entitled "Dense wavelength division multiplexing-passive optical network system utilizing self-injection locking of Fabry-Perot laser diodes," which is incorporated herein by reference as if reproduced in its entirety. The output of each of the FP lasers in the DWDM transmitter may be filtered by a filter at a selected wavelength and then may be fed back into the FP laser. The bandwidth (or spectrum) of the filter may be narrower (typically <1 nm) than the spectral width of the FP laser. In addition, it is worth noting that U.S. Pat. No. 7,167,649 does not discuss mode spacing. Regardless, the FP laser may operate at a wavelength that may overlap with the peak transmission of the filter. The light output of the laser may have a specific polarization, e.g. a transverse electric (TE) mode. Using the FP laser and filter configuration may reduce the cost of the DWDM transmitter system. However, since the FP laser may be configured to operate at a single polarization, any light that may be reflected back into the FP laser at different polarization may affect the operation of the FP laser, e.g. change its output wavelength and/or intensity. The light may be reflected back from any component coupled to the FP laser, such as a WDM multiplexer, and may have any polarization due to inherent birefringence in the fibers that couple between the components. The birefringence in fibers may vary with changes to the environment, such as vibrations and temperature variations, and therefore the polarization of the reflected light may vary with time, which may cause unstable laser output over time.

Disclosed herein is a system and apparatus for improving the operation of the optical transmitter in optical networks. The optical transmitter may be configured to operate at a selected wavelength and a single polarization. The optical transmitter design may be improved to provide stable optical transmitter operation and maintain the output wavelength and/or intensity. Specifically, the optical transmitter may be configured to allow back into the laser a portion of the reflected light that may have the same polarization of the laser and to substantially isolate reflected light that may have a different polarization. Since the light that is reflected back into the laser may have substantially the same polarization as the light inside the laser, the operation of the laser may remain stable and hence its output wavelength and/or intensity may be maintained. Improving the operation of the narrow spectrum laser may reduce the cost of transmitters in optical networks, for instance in comparison to tunable lasers and DFB lasers.

Figure 1:
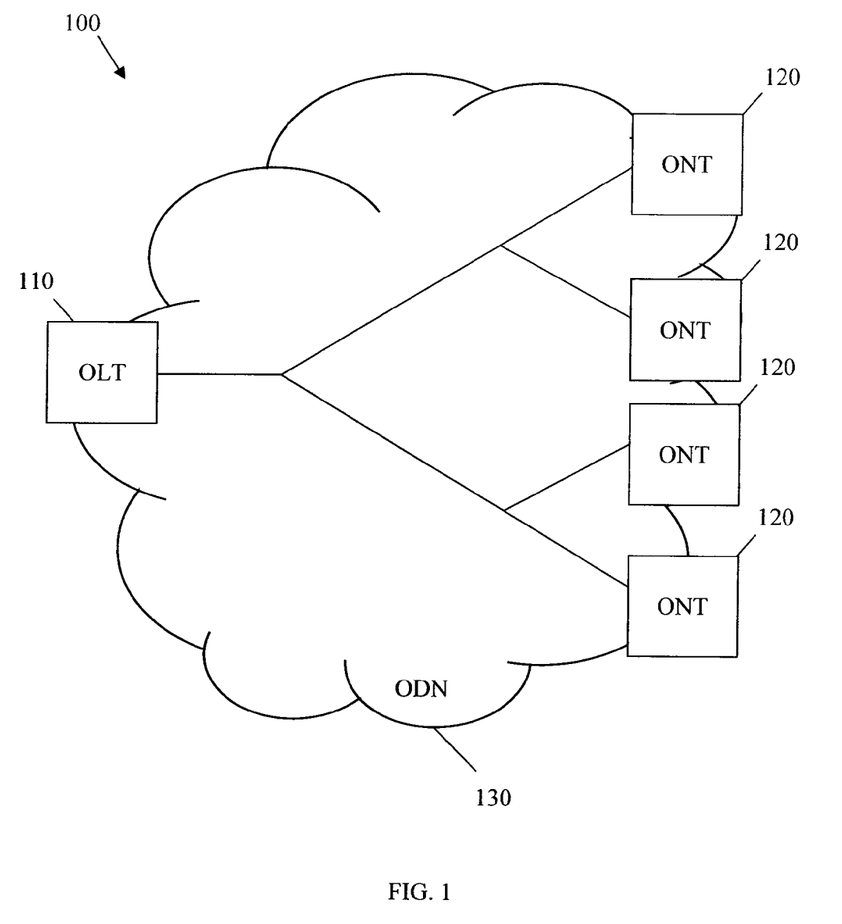
FIG. 1 is a schematic diagram of an embodiment of a passive optical network (PON).

The improved laser based transmitter may be used in a plurality of optical networks, such as DWDM transport or access networks, passive optical networks (PONs), Synchronous Optical Networking (SONET)/Synchronous Digital Hierarchy (SDH) networks, and optical Ethernet networks. FIG. 1 illustrates one embodiment of a PON 100. The PON 100 comprises an optical line terminal (OLT) 110, a plurality of optical network terminals (ONTs) 120, and an optical distribution network (ODN) 130. The PON 100 is a communications network that does not require any active components to distribute data between the OLT 110 and the ONTs 120. Instead, the PON 100 uses the passive optical components in the ODN 130 to distribute data between the OLT 110 and the ONTs 120. Examples of suitable PONs 100 include the asynchronous transfer mode PON (APON) and the broadband PON (BPON) defined by the ITU-T G.983 standard, the Gigabit PON (GPON) defined by the ITU-T G.984 standard, the Ethernet PON (EPON) defined by the IEEE 802.3ah standard, and the wavelength division multiplexing PON (WDM-PON), all of which are incorporated by reference as if reproduced in their entirety.

Figure 2:
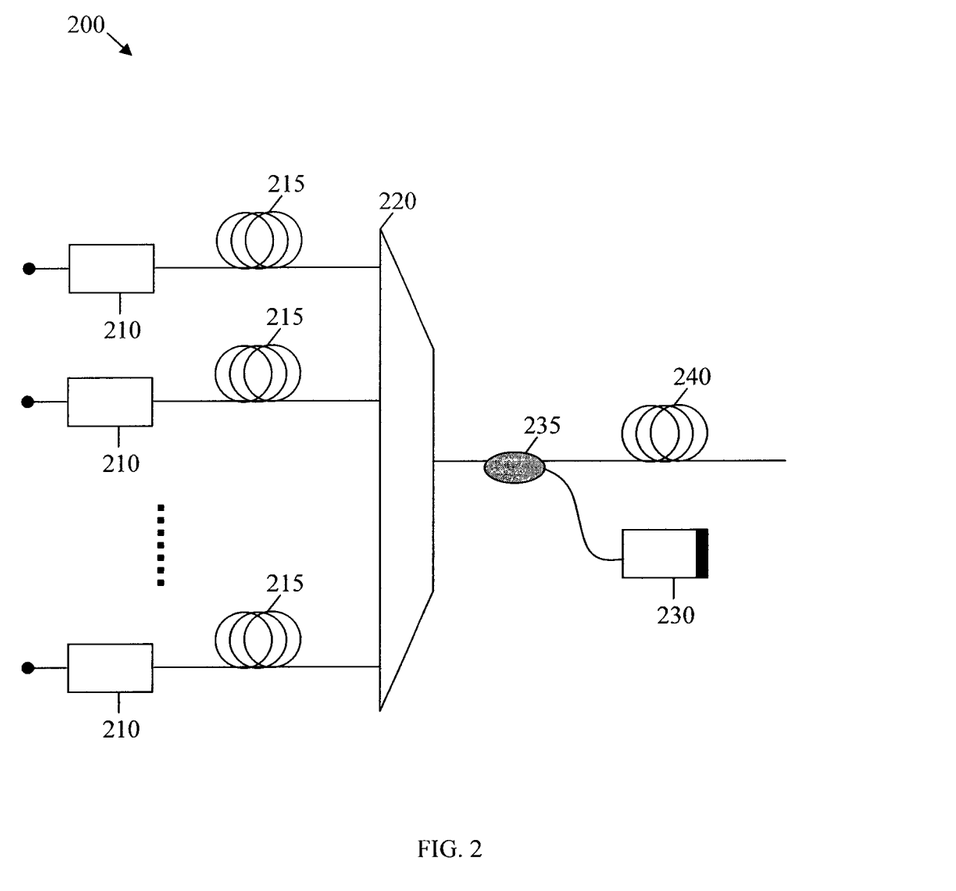
FIG. 2 is a schematic diagram of an embodiment of a WDM transmitter.

In an embodiment, the WDM transmitters may comprise a plurality of lasers, which may be configured to provide a colorless optical transmitter. For instance, the transmitter may be a WDM or DWDM transmitter that comprises a plurality of FP lasers, where the FP lasers may operate at about the same wavelength spectrum. The transmitter may comprise discrete components, such as FP lasers, a WDM filter, rotators, and a reflector. The components may be coupled to one another and mounted on a card or optical platform. Alternatively, the transmitter may be an integrated laser transmitter on a chip. The lasers may be configured for improved single mode operation, e.g. by allowing selection of a single FP cavity mode overlapping with a WDM filter wavelength and a single polarization inside the laser chip or cavity, and maintaining the output wavelength and intensity, as described in detail below. In another embodiment, the transmitter may comprise a plurality of reflective semiconductor optical amplifiers (RSOAs) instead of FP lasers, which may be configured for narrow spectrum operation at WDM defined wavelengths. With a RSOA, the facet for input/output may not be very reflective. As such, a cavity may not be formed, and thus there may not be single mode operation FIG. 2 illustrates one embodiment of a WDM transmitter 200, which may be based on an improved single mode laser design. The WDM transmitter 200 may comprise a plurality of laser transmitters 210, a plurality of first fibers 215, a WDM multiplexer 220, a coupler 235, a light reflector 230, and a second fiber 240 arranged as shown in FIG. 2. The second fiber 240 may couple the WDM transmitter 200 to the optical network, e.g. to other network components. In an embodiment, the laser transmitters 210 and the WDM multiplexer 220 may all be at different physical locations, perhaps even kilometers apart.

In an embodiment, the laser transmitters 210 may be configured to transmit light at a wavelength range. Each laser transmitter 210 may comprise a laser, such as an FP laser or RSOA, which may be coupled to a polarizer and a rotator. The polarizer and rotator in the laser transmitter 210 and the light reflector 230 may be configured to support a single polarization inside the laser, as described in detail below. The light emitted from each laser transmitter 210 may be transported to the multiplexer 220 via the corresponding first fiber 215. The light waves transported by the first fibers 215 from the laser transmitters 210 may be combined into a single light wave at the multiplexer 220. Each of the laser transmitters 210 may also be modulated separately, for instance using electrical drivers that may be coupled to the laser transmitters 210.

In an embodiment, the output wavelengths of the laser transmitters 210 may drift over time and may be realigned with desired transmission wavelengths (transmission peaks) of the multiplexer 220, for instance by tuning the output wavelengths of the laser transmitters 210. The laser transmitters 210 may comprise FP lasers and the output wavelengths of the FP lasers may be fine tuned using temperature control, where each FP laser may be coupled to a heater and/or a thermoelectric cooler (TEC). The temperature of the heater and/or cooler may be controlled, e.g. via electric current, to increase or decrease the temperature of the laser chip in the FP lasers and thus increase or decrease the output wavelengths. In another embodiment, the laser transmitters 210 may comprise RSOAs that may have a broad gain spectrum and may not need temperature control. However, in some cases, the gain spectrum of the RSOAs may be affected, for instance by unintended external reflections into the RSOAs, which may cause undesired periodical gain peaks in the RSOAs. Further, the intrinsic gain peak of semiconductor diodes in the RSOAs may shift with temperature fluctuations, e.g. from about 0.4 nm per degree Celsius (nm/° C.) to about 0.7 nm/° C. In telecommunication applications where the operating temperature may have a range from about 80° C. to about 100° C., a significant shift of the RSOA gain peak may occur (e.g. from about 40 nm to about 70 nm) that could affect the performance of the system. In such cases, temperature control may be used for the laser transmitters 210 to compensate for the shift in the RSOA gain peak.

In an embodiment, the multiplexer 220 may be an arrayed waveguide grating (AWG) configured to combine a plurality of light waves from the first fibers 215 into a combined light wave that propagates in the second fiber 240. The AWG may also filter the light waves that correspond to different laser transmitters 210 at different wavelengths. As such, the transmitted combined light wave may comprise a plurality of distinct wavelength channels, such as the DWDM channels described in the ITU-T standard G.694.1 and/or the coarse WDM (CWDM) channels described in the ITU-T G.694.2. In other embodiments, the multiplexer 220 may be an optical interleaver, a fiber Bragg grating multiplexer, an optical add-drop multiplexer (OADM), a reconfigurable OADM (ROADM), or any type of WDM filter. The multiplexer 220 may also be configured to demultiplex the reflected light from the light reflector 230 into a plurality of light waves or channels and forward each channel to a corresponding laser transmitter 210. Specifically, the demultiplexer 220 may split the reflected light from the light reflector 230 into a plurality of reflected light waves at different wavelengths and forward each wave back to the corresponding laser transmitter 210.

The coupler 235 may be configured to forward a portion of the combined light wave from the multiplexer 220 to the light reflector 230 and forward back a reflected light from the light reflector 230 to the multiplexer 220. For instance, the coupler 235 may be a partially reflective mirror that allows the transmission of a portion of the light from the multiplexer 220 down the fiber 240 and reflects or directs another portion of the light to the light reflector 230. The light reflector 230 may comprise a rotator coupled to a mirror, which may be configured to receive the light from the coupler 235, rotate the light polarization, and reflect the rotated light back to the multiplexer 220. Hence, the reflected light that is sent to the multiplexer 220 and then to the laser transmitters 210 may be further rotated in the laser transmitters 210 to allow back into the laser transmitters 210 reflected light that has the same polarization in the laser cavity and substantially eliminate reflected light that has a different polarization. Allowing substantially only reflected light that has the same polarization back into the laser cavity may improve laser operation and maintain a stable output. In some embodiments, one or more band-pass optical filters 236 may be positioned between the multiplexer 220 and the reflector 230 and/or between the multiplexer 220 and the coupler 235.

In an embodiment, the multiplexer 220 may be an AWG that has a finite free spectral range (FSR), which may be smaller than or comparable to the gain spectrum of the lasers in the laser transmitters 210. For example, for a transmitted light wavelength equal to about 1,500 nm, the (FSR) of the AWG may be equal to about 50 nm. The FSR may comprise a plurality of transmission peaks, which may be about equally spaced across the spectrum. Therefore, without using additional filters, the AWG may allow the transmission of a plurality of wavelength bands from the laser transmitters 210. To provide a single wavelength band from the laser transmitters 210, the light reflector 230 may be configured to reflect a portion of the light back to the multiplexer 220 that has a narrower bandwidth than the FSR. Specifically, the reflection bandwidth of the minor in the light reflector 230 may be aligned with one of the transmission peaks of the FSR and substantially exclude the remaining transmission peaks. Thus, the reflection bandwidth of the light reflector 230 may promote light transmissions in one wavelength band, such as the C-band (e.g. from about 1,529 to about 1,562 nm), and suppress transmissions at other wavelength bands.

Figure 3:
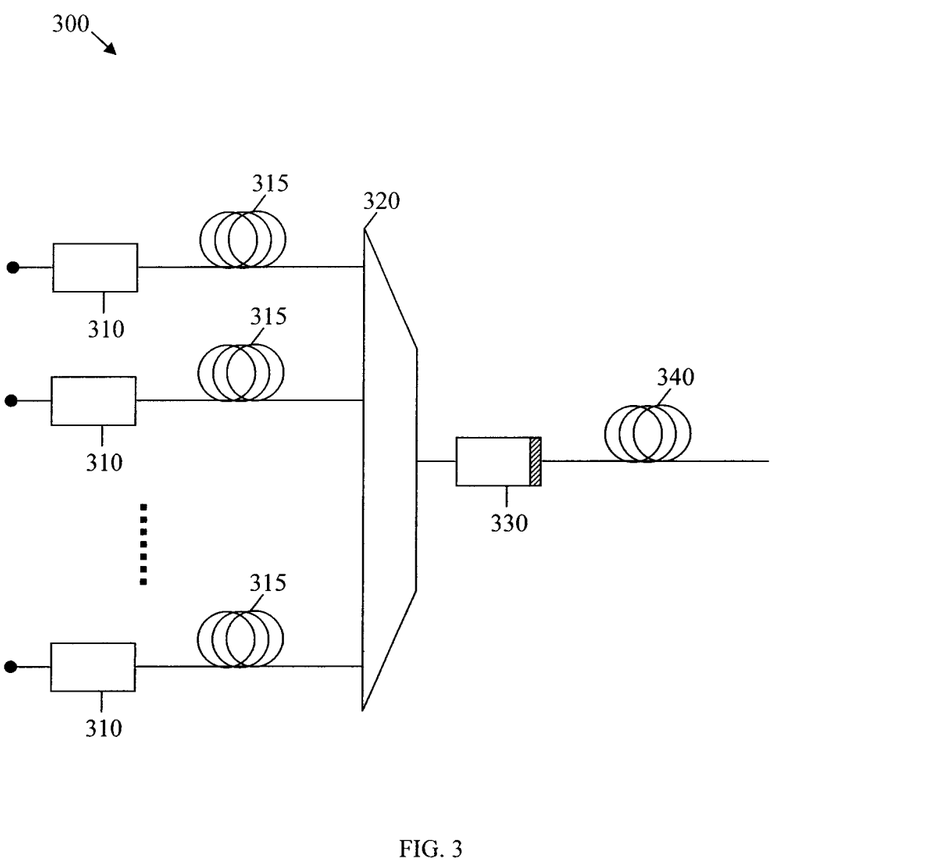
FIG. 3 is a schematic diagram of another embodiment of a WDM transmitter.

FIG. 3 illustrates another embodiment of a WDM transmitter 300, which may be based on the improved single mode laser design. The WDM transmitter 300 may comprise a plurality of laser transmitters 310, a plurality of first fibers 315, a multiplexer 320, a light reflector 330, and a second fiber 340 configured as shown in FIG. 3. The components of the WDM transmitter 300 other than the light reflector 330 may be configured similar to the corresponding components of the WDM transmitter 200. However, the light reflector 330 may be directly coupled to the second fiber 340, e.g. without using a coupler. Specifically, the light reflector 330 may be coupled to the multiplexer 320 at one side and to the second fiber 340 at the other side and may comprise a partially reflective mirror on the side of the second fiber 340. As such, the light reflector 330 may transmit a portion of the light from the multiplexer 320 down the fiber 340 and reflect back another rotated portion of the light to the multiplexer 320. As in the case of the WDM transmitter 200, the light reflector 330 of the WDM transmitter 300 may comprise a rotator and a mirror that reflect and rotate a light portion to promote a single polarization in the laser transmitters 310 and hence improve single mode laser operation.

Figure 4:
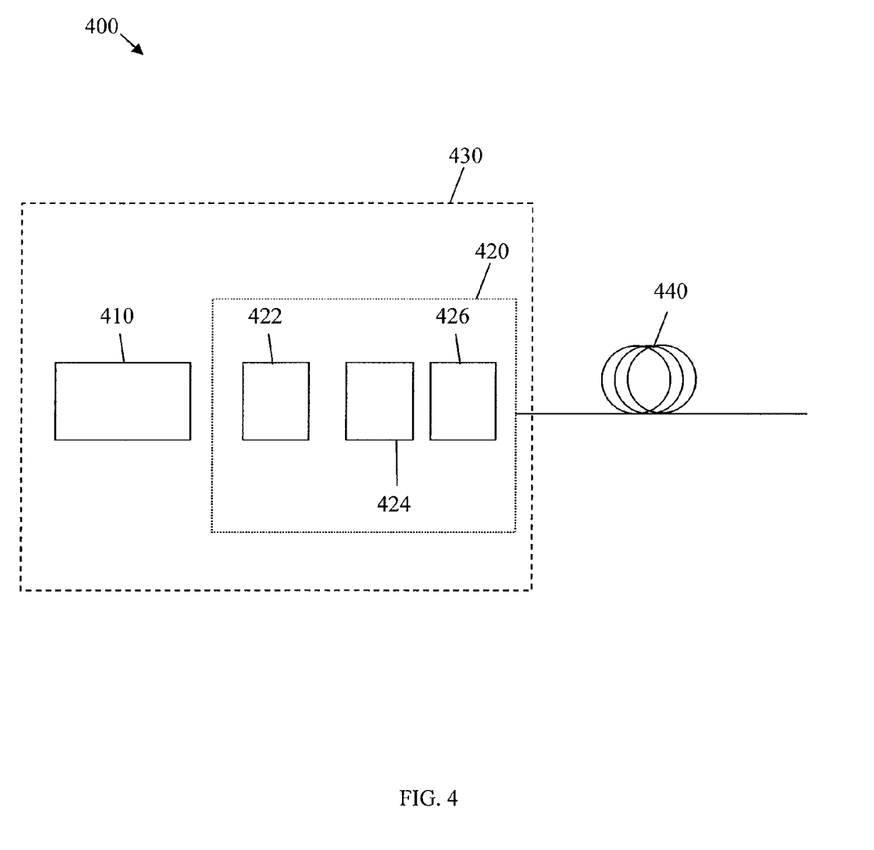
FIG. 4 is a schematic diagram of a conventional laser transmitter.

FIG. 4 illustrates an embodiment of a conventional laser transmitter 400. The laser transmitter 400 may comprise a laser 410 and an isolator 420, which may be coupled to one another and packaged in a casing 430. The laser 410 and the isolator 420 may be aligned and positioned directly to one another or coupled via a fiber (not shown). In some embodiments, the laser 410 and the isolator 420 may also be coupled using at least one lens (not shown), which may be positioned between the two. The laser transmitter 400 may also comprise a fiber 440, which may be coupled to the isolator 420. In some embodiments, the laser 410 and the isolator 420 may be integrated or coupled on a platform or a chip.

The isolator 420 may comprise a Faraday rotator 424 that may be coupled to two polarizers 422, 426. The polarizer 422 may be configured to transmit a portion of the light that may be polarized similar to the light in the laser 410, e.g. at about zero degrees with respect to the polarization of the light in the laser cavity. Additionally, the polarizer 422 may allow back into the laser 410 only reflected light that has substantially the same polarization as in the laser cavity. The reflected light that has orthogonal polarization to the laser cavity may affect the laser operation and change its output intensity and/or wavelength, which may not be desired. The undesired light polarizations may be blocked by the polarizer 422 to maintain the light polarization in the laser cavity. Similarly, the polarizer 426 may be configured to transmit a portion of the light that may be polarized about 45 or about −45 degrees with respect to the polarization of the light in the laser cavity, aligned with the output from the Faraday rotator 424. Therefore, all reflected light would be first filtered by the polarizer 426 to become 45 (or −45) degrees polarized, and then be rotated by the Faraday rotator to become 90 degrees polarized, which would be blocked by the polarizer 422.

Figure 5:
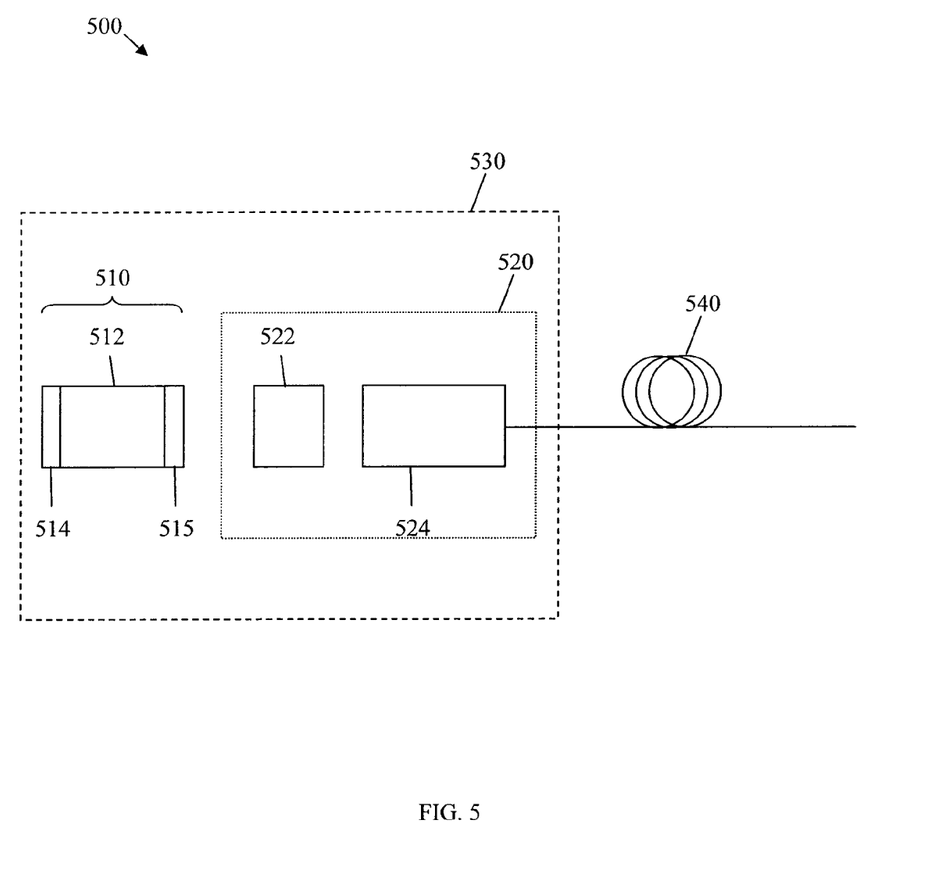
FIG. 5 is a schematic diagram of an embodiment of a laser transmitter.

FIG. 5 illustrates an embodiment of a laser transmitter 500, which may be configured for improved single mode operation, e.g. improved single wavelength/polarization operation. The laser transmitter 500 may be used in a WDM transmitter, e.g. the WDM transmitter 200, or the WDM transmitter 300. The laser transmitter 500 may comprise a laser 510 and a modified isolator 520, which may be coupled to one another and packaged in a casing 530. The laser 510 and the modified isolator 520 may be aligned and positioned directly to one another or coupled via a fiber (not shown). In some embodiments, the laser 510 and the modified isolator 520 may also be coupled using at least one lens (not shown), which may be positioned between the two. The laser transmitter 500 may also comprise a fiber 540, which may be coupled to the modified isolator 520. In some embodiments, the laser 510 and the modified isolator 520 may be integrated or coupled on a platform or a chip. In contrast with the conventional isolator 420, the modified isolator 520, would allow the intended reflection for the rotator mirror (230 or 330) to pass, but block majority of the stray reflections in the optical path.

In an embodiment, the laser 510 may be a FP laser that comprises a laser gain chip 512, and a first reflection facet 514 and a second reflection facet 515 on opposite sides of the laser chip 512. The laser chip 512 may comprise a semiconductor gain block, which may be biased using electric current or voltage to emit light at a wavelength range. The semiconductor gain block may have a relatively broad gain spectrum, e.g. a spectrum width from about 40 nm to about 50 nm. The laser chip 512, the first reflection facet 514, and the second reflection facet 515 may determine a cavity of the laser 510. The first reflection facet 514 may be coated with a high-reflection (HR) coating (e.g. metal or thin dielectric films) that reflects the light emitted by the laser chip. The second reflection facet 515 may reflect the light in the opposite direction of the first reflection facet 514. As such, a portion of the light emitted by the semiconductor gain block may undergo multiple internal reflections, e.g. bounce back and forth inside the cavity and between the first reflection facet 514 and the second reflection facet 515. The second reflection facet 515 may allow a portion of the light to exit the laser 512, e.g. via an aperture. Additionally, the second reflection facet 515 may be coated with an AR coating on the side facing the modified isolator 520. As such, a substantial portion of the light reflected back to the laser 510 may be allowed into the laser cavity.

The cavity length and the refractive index of the semiconductor gain block may support the lasing condition for a plurality of longitudinal modes in the cavity. The longitudinal modes may correspond to a plurality of wavelengths, which may overlap with the wavelength range of the semiconductor gain block. The number of the longitudinal modes that may be supported may be limited by the width of the gain spectrum. For instance, for each mode, the wavelength may be obtained according to $\lambda = 2nL/m$, where $\lambda$ is the wavelength, n is the refractive index of the semiconductor gain block, l is the cavity length, and m is the mode number. The spacing between the modes may be determined by the length of the cavity. For instance, the number of mode spacings may be obtained according to $\Delta v = c/2nl$, where $\Delta v$ is the mode spacing and c is the speed of light.

The internal reflection of the light in the cavity may cause an optical gain, which may produce a coherent light output from the laser 510. The coherent light output may be transmitted from the second reflection facets 515 to the modified isolator 520. The transmitted light may be filtered at a single wavelength or a wavelength range that is narrower than the wavelength range of the semiconductor gain block using a filter (not shown), which may be a WDM filter such an arrayed waveguide grating (AWG). The filter may be positioned in front of the second reflection facet 515 or in front of the laser transmitter 500. Accordingly, the laser 510 may be configured to transmit light at a single mode and single wavelength, which may substantially overlap with a transmission peak of the WDM filter. Typically, the mode spacing in the cavity may be greater than about 100 GHz and the WDM filter may have a bandwidth equal to about 50 GHz at about −3 decibels (dB).

In an alternative embodiment, the laser 510 may be a RSOA that comprises only a first reflection facet or additionally a second reflection facet that has a substantially smaller reflection than the corresponding reflection facet of a FP laser. As such, the optical gain in the cavity of the RSOA may have less periodical dependence to wavelength in comparison to the FP laser. Further, the optical gain of the RSOA may be less dependent of the polarization of the light in the cavity.

The modified isolator 520 may comprise a polarizer 522 that may be coupled to a Faraday rotator 524. The polarizer 522 may be configured to transmit a portion of the light that may be polarized similar to the light in the laser 510, e.g. at about zero degrees with respect to the polarization of the light in the laser cavity. Additionally, the polarizer 522 may allow back into the laser 510 only reflected light that has substantially the same polarization as in the laser cavity. The reflected light that has orthogonal polarization to the laser cavity may affect the laser operation and change its output intensity and/or wavelength, which may not be desired. The undesired light polarizations may be blocked by the polarizer 522 to maintain the light polarization in the laser cavity. The light polarization in the cavity may also correspond to the desired output wavelength of the laser. Consequently, single wavelength and single polarization may be improved in the cavity.

The Faraday rotator 524 may be configured to rotate the light incoming from one side by about 45 or about −45 degrees and transmit the rotated light at the opposite side. The Faraday rotator 524 may comprise an optical medium that rotates the light, such as a paramagnetic glass. The Faraday rotator 524 may provide a light from any of the two sides that may be rotated by about 45 or about −45 degrees with respect to the other side. For instance, the Faraday rotator 524 may rotate an incoming light from the laser 510 and transmit the rotated light to a multiplexer (not shown). The Faraday rotator 524 may also rotate an incoming reflected light from the multiplexer and transmit the rotated light to the laser 510. Thus, a light that passes twice through the Faraday rotator 524, such as a reflected light in a roundtrip path, may be rotated by about 90 or about −90 degrees by the Faraday rotator 524. Thus most stray reflections that may be introduced by the fiber connectors or slices in the fibers will be rejected by the polarizer 522. It will be appreciated that the modified isolator 520 may not comprise a second polarizer, e.g. a 45 or −45 degrees polarizer, between the Faraday rotator 524 and the fiber 540, as that typically used in conventional isolators.

Figure 6:
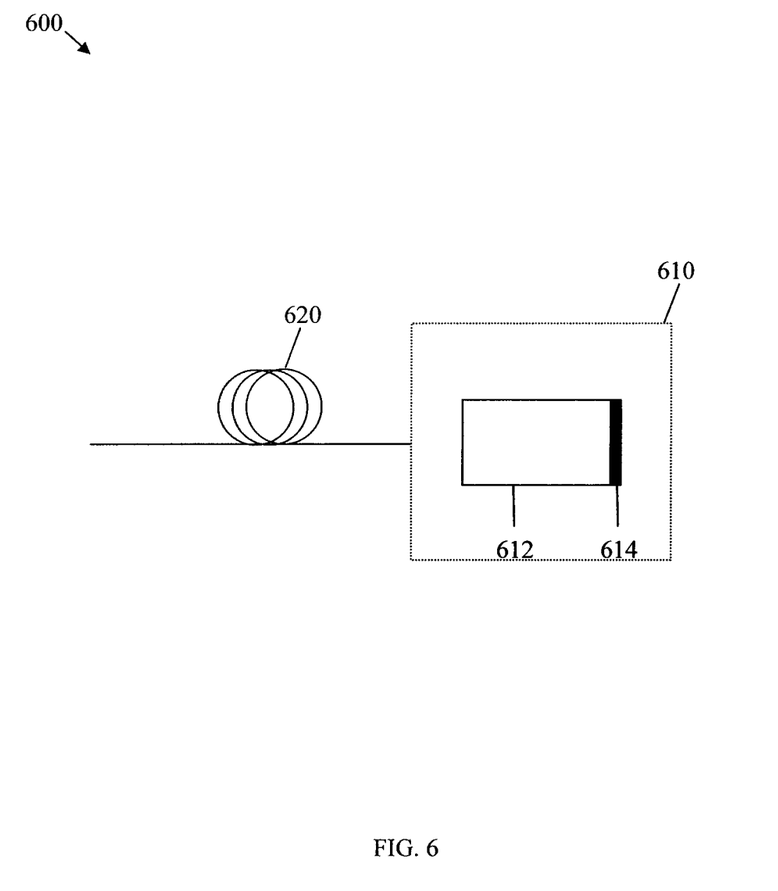
FIG. 6 is a schematic diagram of an embodiment of a light reflector.

FIG. 6 illustrates an embodiment of a light reflector 600, which may be used in a WDM transmitter, such as the light reflector 230 in the WDM transmitter 200. Specifically, the light reflector 600 may be used in conjunction with a laser transmitter, such as the laser transmitter 500 to improve single mode operation of the laser. The light reflector 600 may comprise a Faraday rotator mirror 610, which may be coupled to a fiber 620. The Faraday rotator mirror 610 may comprise a Faraday rotator 612 and a mirror 614 that is coupled to the Faraday rotator 612.

The Faraday rotator 612 may be configured to rotate the light incoming from one side by about 45 or about −45 degrees and transmit the rotated light at the opposite side. For instance, the Faraday rotator 612 may rotate an incoming light from a multiplexer (not shown) and transmit the rotated light to the mirror 614. The mirror 610 may be configured to reflect the incoming rotated light back towards the Faraday rotator 612. In some embodiments, the mirror 612 may be configured to filter the incoming light, by reflecting a portion of the light has a narrower bandwidth, as described above. For instance, the mirror 612 may be coated with a band-pass coating that matches a desired wavelength band. The Faraday rotator 612 may also rotate an incoming reflected light from the mirror 614 and transmit the rotated light to the multiplexer. Thus, a light that passes twice through the Faraday rotator 612, such as a reflected light in a roundtrip path, may be rotated by about 90 or about −90 degrees by the Faraday rotator 612.

When the Faraday rotator 612 is combined with another Faraday rotator along a roundtrip path for a reflected light, the reflected light may be rotated by about 180 degrees or about 0 degrees, and thus may be substantially aligned with the initially transmitted light. For instance, when combining the laser transmitter 500 and the light reflector 600 in the same WDM transmitter, the light reflected back into the laser 510 may be rotated by about 180 degrees or about 0 degrees, and thereby may be aligned with the light inside the laser 510. The combination of the two Faraday rotators may be used to substantially align the reflected light with the initially transmitted light regardless of random or arbitrary birefringence, which may exist in the fibers between the laser and the reflector components. Thus, the polarization of the light inside the laser 510 may be maintained and the stability of the single operation mode may be improved. Specifically, a first rotator (e.g. Faraday rotators 524) may be positioned in front of a laser (e.g. laser 510) on the transmission side and a second rotator (e.g. Faraday rotator 612) may be positioned in front of a reflector (e.g. light reflector 600) on the reflection side. Additionally, if a multiplexer is positioned between the first and second rotators, unwanted changes in the polarization of the light that may be introduced by the multiplexer components may be substantially realigned in the laser or isolated from the laser. The combined rotators configuration may also substantially eliminate unwanted changes in polarizations that may be introduced by the fiber connectors or slices in the fibers.

The polarization of the light along the roundtrip path may be analyzed and traced at different components between the laser and the reflector of the WDM transmitter. For instance, the light propagation may be initially in the z direction (e.g. from the laser to the reflector) and the light may be polarized at about zero degrees, which may also be substantially aligned with the light inside the cavity of the laser. The light may then pass through the first rotator in front of the laser and may be rotated by about 45 degrees. The rotated light may then pass through the multiplexer and may be further rotated by an arbitrary rotation before arriving to a light reflector (e.g. light reflector 600), due to inherent birefringence and/or other effects in the system.

The light may then be reflected by the light reflector in front of the multiplexer, where the light may pass twice by a second rotator. As such, the light may be further rotated by about 90 degrees and the reflected light propagation may be in the −z direction (e.g. from the reflector to the laser). The light field corresponding to the light arriving at the reflector may be expressed by $a_1 x + a_2 y$, where $a_1$ is a first light field component aligned in the x direction and $a_2$ is a second light field component aligned in the y direction. The first light field component and the second light field component may be orthogonal. Accordingly, after undergoing about 90 degrees rotation, the reflected light field from the reflector may be expressed by $-a_2 x + a_1 y$.

In the roundtrip route, the reflected light may pass again through the multiplexer before arriving to the laser and may be further rotated due to the inherent birefringence and/or other effects in the system. However, since the reflected light propagation is in the opposite direction to the initially transmitted light, the reflected light may be further rotated substantially by the inverse arbitrary rotation of the initially transmitted light, which may effectively cancel the inherent birefringence and/or other arbitrary polarization effects introduced to the propagating light in the system. The reflected light field may then pass again through the first rotator before arriving back to the laser and hence may be further rotated by about 45 degrees. Thus, the overall polarization of the reflected light that arrives back to the laser may be equal to about 180 degrees, and thus the reflected light may be substantially aligned with the light inside the cavity of the laser. It will be appreciated that while 45/45/45/45 rotations are described herein, 45/−45/−45/45, −45/−45/−45/−45, or −45/45/45/−45 rotations could be used instead.

Figure 7:
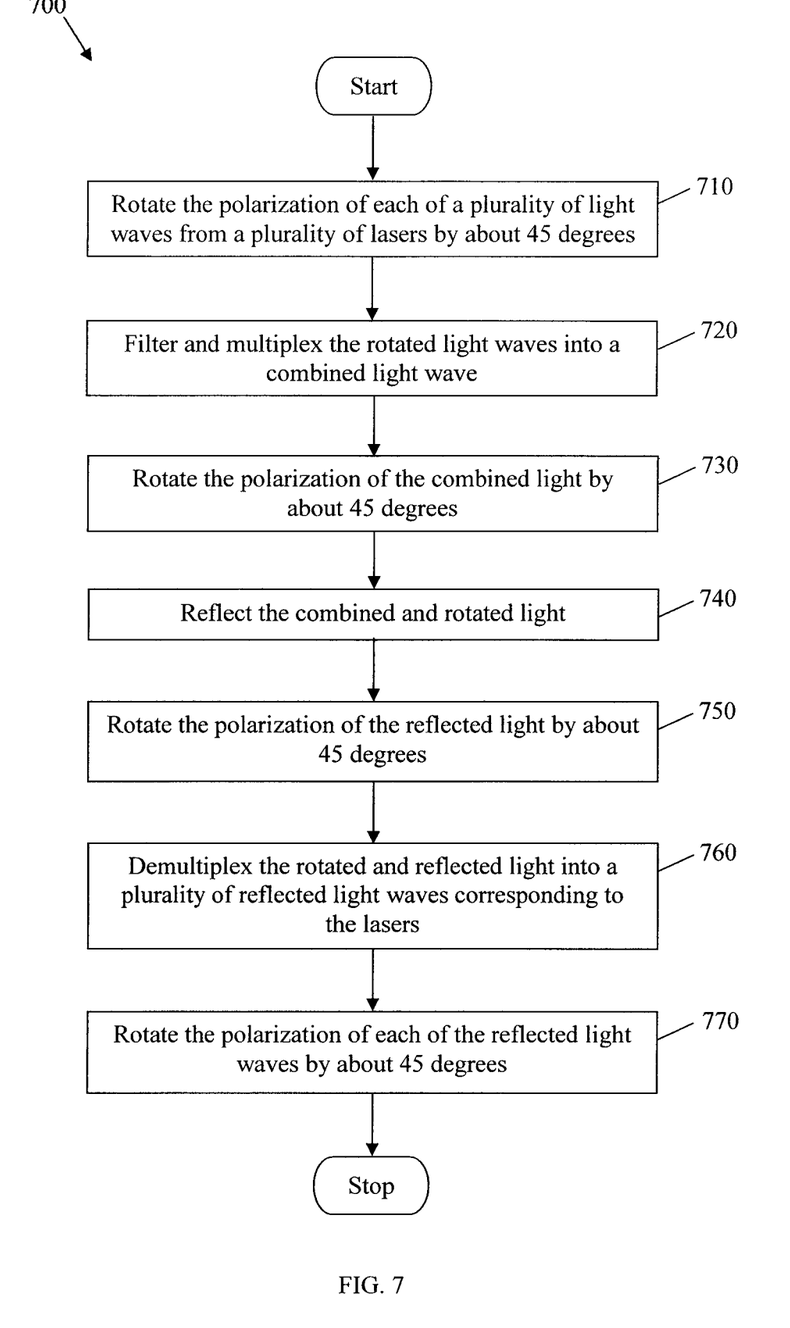
FIG. 7 is a flowchart of an embodiment of a single laser polarization operation method.

FIG. 7 illustrates one embodiment of a single laser polarization operation method 700, which may be used to maintain a single polarization inside a laser cavity for a laser or RSOA to improve its operation at wavelength defined by an external filter. For instance, the single laser polarization operation method 700 may be used in the WDM transmitter 200, or the WDM transmitter 300. The method 700 may begin at 710, where the polarization of each of a plurality of light waves from a plurality of lasers may be rotated by about 45 or about −45 degrees. For instance, the light transmitted from the laser 510 may be rotated by the Faraday rotator 524 by about 45 or about −45 degrees. In some embodiments, before rotating the transmitted light, the light from each of the lasers may be aligned with the polarization of the single mode inside the laser cavity. For instance, the polarizer 522 may be used between the laser 510 and the Faraday rotator 524 to align the light from the laser with the single mode inside the laser cavity. At block 720, the rotated light waves may be filtered at different wavelengths and multiplexed into a combined light wave. For instance, the multiplexer 220 may filter the light waves from the laser transmitters 210 at different wavelengths and combine the light waves into a single light wave.

At block 730, the polarization of the combined light wave may be rotated by about 45 or about −45 degrees. At block 740, the combined and rotated light may be reflected. At block 750, the polarization of the reflected light may be rotated by about 45 or about −45 degrees. For instance, at the light reflector 230, the incoming combined light wave from the multiplexer 220 may be first rotated by about 45 or about −45 degrees, reflected, and then further rotated by about 45 or about −45 degrees. At block 760, the rotated and reflected light may be demultiplexed into a plurality of reflected light waves corresponding to the different lasers. For instance, the multiplexer 220 may split the reflected light from the light reflector 230 into a plurality of light waves at different wavelengths, which may be forwarded to the corresponding laser transmitters 210.

At block 770, the polarization of each of the reflected light waves may be rotated by about 45 or about −45 degrees. For instance, the reflected light from one port of the multiplexer 220 may be rotated by the Faraday rotator in the laser transmitter 210 by about 45 or about −45 degrees. In some embodiments, after rotating the reflected light, the light may be aligned with the polarization of the single mode inside the laser cavity. For instance, the reflected light that is forwarded from the Faraday rotator 524 to the laser 510 may be aligned by the polarizer 522 with the single mode inside the laser cavity. The method 700 may then end.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_1+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An apparatus comprising:
    a plurality of laser transmitters each comprising a laser cavity and a polarization rotator;
    a polarization rotator mirror coupled to the laser transmitters; and
    a multiplexer positioned between the laser transmitters and the polarization rotator mirror,
    wherein the polarization rotator and the polarization rotator mirror are configured to reflect back into the laser cavity light that has the same polarization as the light in the laser cavity.

2. The apparatus of claim 1, wherein each of the laser transmitters comprises a polarization rotator that is configured to rotate light polarization by about 45 or about −45 degrees.

3. The apparatus of claim 1, wherein the polarization rotators are Faraday rotators.

4. The apparatus of claim 1, wherein each of the laser transmitters further comprises a laser and a zero degree polarizer positioned between the laser and the polarization rotator.

5. The apparatus of claim 4, wherein at least some of the lasers comprise Fabry-Perot (FP) lasers.

6. The apparatus of claim 4, wherein at least some of the lasers comprise reflective semiconductor optical amplifiers (RSOAs).

7. The apparatus of claim 1 further comprising a coupler positioned between the polarization rotator mirror and the multiplexer, wherein the coupler is configured to forward a first portion of the light from the multiplexer away from the multiplexer over a first fiber and a second portion of the light from the multiplexer to the rotator mirror over a second fiber.

8. The apparatus of claim 7 further comprising at least one band-pass optical filter positioned between the multiplexer and the polarization rotator mirror and/or between the multiplexer and the coupler.

9. The apparatus of claim 1, wherein the polarization rotator mirror comprises a partially reflective mirror that is configured to reflect substantially all light except light within a single wavelength channel.

10. The apparatus of claim 1, wherein the polarization rotator mirror is configured to reflect and rotate light polarization by about 90 or about −90 degrees.

11. The apparatus of claim 1, wherein the multiplexer is an arrayed waveguide grating (AWG).

12. The apparatus of claim 1, wherein the multiplexer is configured to filter light waves that correspond to different wavelengths.

13. An apparatus comprising:
    a laser having a laser cavity configured to generate a light having a wavelength and a polarization;
    a first rotator coupled to the laser and configured to rotate the light's polarization by about 45 or about −45 degrees;
    a second rotator configured to rotate the light's polarization by about 45 or about −45 degrees;
    a mirror coupled to the second rotator and configured to reflect at least a portion of the light; and
    a wavelength division multiplexing (WDM) filter positioned between the first rotator and the second rotator,
    wherein the first rotator the second rotator and the mirror are configured to reflect the light back into the laser cavity, and
    wherein the reflected light has the same polarization as the light in the laser cavity.

14. The apparatus of claim 13 further comprising a polarizer positioned between the laser and the first rotator.

15. The apparatus of claim 14, wherein the first rotator and the second rotator are configured to rotate light polarization that is reflected back to the laser by about 0 or about 180 degrees and substantially align the reflected light with the light emitted by the laser.

16. The apparatus of claim 15, wherein rotating light that is reflected back to the laser by about 0 or about 180 degrees substantially eliminates unwanted polarizations of the light that are different than the polarization of the light in the laser cavity.

17. The apparatus of claim 14, wherein the laser comprises a back facet that is coated with a high-reflection (HR) coating and a front facet that is coated with an anti-reflection (AR) coating.

18. The apparatus of claim 13, wherein the mirror has a reflection bandwidth that is aligned with one of a plurality of transmission peaks of the WDM filter.

19. The apparatus of claim 13 further comprising a coupler positioned between the second rotator and the WDM filter, wherein the coupler is configured to forward a first portion of the light from the WDM filter away from the WDM filter on a first fiber and a second portion of the light from the WDM filter to the second rotator over a second fiber.

20. A method comprising:
  rotating a polarization of a light wave from a laser cavity by about 45 or about −45 degrees;
  multiplexing the light wave with other light waves into a combined light wave;
  rotating and reflecting the combined light wave to generate a reflected light wave with polarization rotated by about 90 or about −90 degrees;
  demultiplexing the reflected light wave corresponding to each of a plurality of lasers from the reflected light wave;
  rotating the polarization of the reflected light wave by about 45 or about −45 degrees; and
  directing back into a laser cavity light that has the same polarization as the light in the laser cavity.

21. The method of claim 20, wherein rotating and reflecting the polarization of the combined light wave by about 90 or about −90 degrees comprises rotating the polarization of the incoming combined light wave by about 45 or about −45 degrees, reflecting the rotated combined light wave, and further rotating the reflected combined light wave by about 45 or about −45 degrees, and wherein multiplexing and demultiplexing the light wave comprises filtering the light wave that corresponds to a plurality of lasers at different wavelengths.

22. The method of claim 20 further comprising:
  forwarding a first portion of the combined light wave on a first fiber; and
  forwarding a second portion of the combined light wave on a second fiber that is then rotated and reflected to generate the reflected light wave.

* * * * *

UNITED STATES PATENT AND TRADEMARK OFFICE
CERTIFICATE OF CORRECTION

PATENT NO. : 8,417,118 B2
APPLICATION NO. : 12/619717
DATED : April 9, 2013
INVENTOR(S) : Yu Sheng Bai It is certified that error appears in the above-identified patent and that said Letters Patent is hereby corrected as shown below:

In the Claims:

Column 12 Line 47 - Claim 13 should read as follows:

13. An apparatus comprising:
a laser having a laser cavity configured to generate a light having a wavelength and a polarization;
a first rotator coupled to the laser and configured to rotate the light's polarization by about 45 or about -45 degrees;
a second rotator configured to rotate the light's polarization by about 45 or about -45 degrees;
a mirror coupled to the second rotator and configured to reflect at least a portion of the light; and
a wavelength division multiplexing (WDM) filter positioned between the first rotator and the second rotator,
wherein, the first rotator, the second rotator, and the mirror are configured to reflect the light back into the laser cavity, and
wherein the reflected light has the same polarization as the light in the laser cavity.

Signed and Sealed this
Fourth Day of June, 2013

Teresa Stanek Rea
*Acting Director of the United States Patent and Trademark Office*